US008039884B2

(12) United States Patent
Noda

(10) Patent No.: US 8,039,884 B2
(45) Date of Patent: Oct. 18, 2011

(54) SEMICONDUCTOR DEVICE HAVING A CONTACT HOLE WITH A CURVED CROSS-SECTION AND ITS MANUFACTURING METHOD

(75) Inventor: Takafumi Noda, Matsumoto (JP)

(73) Assignee: Seiko Epson Corporation (JP)

( * ) Notice: Subject to any disclaimer, the term of this patent is extended or adjusted under 35 U.S.C. 154(b) by 217 days.

(21) Appl. No.: 12/192,172

(22) Filed: Aug. 15, 2008

(65) Prior Publication Data

US 2009/0072287 A1 Mar. 19, 2009

(30) Foreign Application Priority Data

Sep. 18, 2007 (JP) ................................. 2007-241017

(51) Int. Cl.
*H01L 21/02* (2006.01)

(52) U.S. Cl. ........ 257/295; 257/296; 257/298; 257/301; 257/303

(58) Field of Classification Search .................. 257/295, 257/296, 300, 303, 306, 310, E21.208, E21.436, 257/E27.104, E21.664, E27.095, E21.663, 257/298, 301

See application file for complete search history.

(56) References Cited

U.S. PATENT DOCUMENTS

| 6,485,988 | B2 | 11/2002 | Ma et al. | |
|---|---|---|---|---|
| 6,534,809 | B2 * | 3/2003 | Moise et al. | 257/295 |
| 6,611,014 | B1 | 8/2003 | Kanaya et al. | |
| 6,982,453 | B2 | 1/2006 | Kanaya et al. | |
| 7,400,005 | B2 * | 7/2008 | Kumura et al. | 257/295 |
| 2005/0127395 | A1 * | 6/2005 | Saigoh et al. | 257/127 |
| 2006/0211212 | A1 * | 9/2006 | Baniecki et al. | 438/396 |
| 2007/0045687 | A1 * | 3/2007 | Kumura et al. | 257/295 |
| 2007/0063241 | A1 * | 3/2007 | Sashida et al. | 257/296 |

FOREIGN PATENT DOCUMENTS

| JP | 09-213798 | 8/1997 |
|---|---|---|
| JP | 2001-036026 | 2/2001 |
| JP | 2001-230382 | 8/2001 |
| JP | 2003-347512 | 12/2003 |
| JP | 2006-310637 | 11/2006 |

\* cited by examiner

*Primary Examiner* — Ha Tran T Nguyen
*Assistant Examiner* — Thanh Y Tran
(74) *Attorney, Agent, or Firm* — Harness, Dickey & Pierce, P.L.C.

(57) ABSTRACT

A semiconductor device includes: a ferroelectric capacitor including a first electrode provided above a substrate, a ferroelectric film provided on the first electrode and a second electrode provided on the ferroelectric film; a hydrogen barrier film that covers a top surface and a side surface of the ferroelectric capacitor; an interlayer dielectric film that covers the ferroelectric capacitor and the substrate; a contact hole that penetrates the interlayer dielectric film and the hydrogen barrier film and exposes the second electrode; a barrier metal that covers a top surface of the second electrode exposed in the contact hole and an inner wall surface of the contact hole and is composed of a conductive material having hydrogen barrier property; and a plug conductive section that is embedded in the contact hole and conductively connects to the barrier metal, wherein the inner wall surface of the contact hole at the hydrogen barrier film includes a concave curved surface facing the interior of the contact hole, and the contact hole at the hydrogen barrier film has an inner diameter that gradually becomes smaller toward the second electrode.

13 Claims, 5 Drawing Sheets

SEMICONDUCTOR DEVICE HAVING A CONTACT HOLE WITH A CURVED CROSS-SECTION AND ITS MANUFACTURING METHOD

The entire disclosure of Japanese Patent Application No. 2007-241017, filed Sep. 18, 2007 is expressly incorporated by reference herein.

BACKGROUND

1. Technical Field

The present invention relates to semiconductor devices, and also relates to methods for manufacturing the same.

2. Related Art

Ferroelectric memory devices (FeRAM) are nonvolatile memories capable of low voltage and high speed operations, and their memory cells can be each formed from one transistor and one capacitor (1T/1C). Accordingly, ferroelectric memory devices can achieve integration at the same level of that of DRAM, and are therefore expected as large-capacity nonvolatile memories.

As the structures of such ferroelectric memory devices, a planer type (see, for example, Japanese laid-open patent application JP-A-2003-347512) and a stacked type (see, for example, Japanese laid-open patent application JP-A-2006-310637) may be enumerated. A ferroelectric memory device in either of the structures is equipped with a ferroelectric capacitor having a ferroelectric film placed between a pair of electrodes. One of the pair of electrodes is connected to a wiring such as a bit line through a transistor, and the other electrode is connected to another wiring such as a ground line. Generally, they are electrically connected through plugs that may be composed of a conductive material such as tungsten or the like.

The ferroelectric film described above may be formed from a ferroelectric material having a perovskite type crystal structure represented by a general formula $ABO_3$, more specifically, lead zirconate titanate ($Pb(Zi, Ti)O_3$:PZT) or the like. The ferroelectric material is an oxide, and therefore needs care so as not to be reduced and thus deteriorated.

Therefore, according to the aforementioned patent documents, a hydrogen barrier film that covers the ferroelectric capacitor is formed, such that the ferroelectric film would not be reduced when exposed to a reducing atmosphere in later steps. According to the document JP-A-2003-347512, when forming plugs on ferroelectric capacitors to be connected to the plugs, a titanium nitride film (barrier metal) having hydrogen barrier property is formed inside contact holes in which the plugs are formed, whereby the ferroelectric film can be prevented from being reduced even when the plugs are formed in a reducing atmosphere.

However, if the measures are not sufficient against the reducing atmosphere at the time of forming the plugs over the ferroelectric capacitor in the methods described in the aforementioned patent documents, the ferroelectric film may possibly be deteriorated. Generally, an interlayer dielectric film is formed to a sufficient thickness, and then polished and thinned by a CMP method or the like, to obtain a desired thickness. However, due to differences in the thickness of the film at the time of film formation and in the polishing amount caused by unevenness in the base layer, the interlayer dielectric film may have differences in its thickness. For this reason, when forming contact holes by etching the interlayer dielectric film and the hydrogen barrier film, the differences in the thickness of the interlayer dielectric film are reflected in the hydrogen barrier film, which makes it difficult to uniformly etch the hydrogen barrier film.

As a result, the side wall of the hydrogen barrier film in the contact hole cannot be formed into a desired shape. When a titanium nitride film (barrier metal) is formed, as described in the document JP-A-2003-347512, weak points are created in the film, such that the titanium nitride film cannot be functioned satisfactorily. For example, the hydrogen barrier film is excessively etched in thinner portions of the interlayer dielectric film, and the side wall of the hydrogen barrier film forms a shape that rises perpendicularly with respect to the upper electrode, as shown in FIG. 1 of the document JP-A-2003-347512. Therefore, it is difficult to fill the barrier metal material well into corners at the stepped sections, which present weak points.

When such weak points are formed, reducing gas may penetrate the ferroelectric capacitor through the weak points at the time of forming the plugs, thereby reducing the ferroelectric film and causing oxygen deficiencies and deterioration. Memory cells with the deteriorated ferroelectric films cannot provide good hysteresis characteristic, and therefore present bit failures, whereby the bit yield is deteriorated.

SUMMARY

In accordance with an advantage of some aspects of the invention, a semiconductor device equipped with ferroelectric capacitors having excellent hysteresis characteristics and excellent bit yield is provided, and a method for manufacturing the same is also provided.

A semiconductor device in accordance with an embodiment of the invention includes: a ferroelectric capacitor including a first electrode provided above a substrate, a ferroelectric film provided on the first electrode and a second electrode provided on the ferroelectric film; a hydrogen barrier film that covers a top surface and a side surface of the ferroelectric capacitor; an interlayer dielectric film that covers the ferroelectric capacitor and the substrate; a contact hole that penetrates the interlayer dielectric film and the hydrogen barrier film and exposes the second electrode; a barrier metal that covers a top surface of the second electrode exposed in the contact hole and an inner wall surface of the contact hole and is composed of a conductive material having hydrogen barrier property; and a plug conductive section that is embedded in the contact hole and conductively connects to the barrier metal, wherein the inner wall surface of the contact hole at the hydrogen barrier film includes a concave curved surface facing the interior of the contact hole, and the contact hole at the hydrogen barrier film has an inner diameter that gradually becomes smaller toward the second electrode.

As a result, the inner wall surface of the contact hole at the stopper film has a concave curved surface facing the interior of the contact hole, such that no steeply rising difference is formed between the top surface of the second electrode and the inner wall surface of the contact hole, and therefore the coverage property of the barrier metal material is improved. Accordingly, generation of weak points in the barrier metal can be prevented, and reducing gas can be prevented from penetrating the ferroelectric film side from the second electrode side through weak points, whereby reduction and deterioration of the ferroelectric film by the reducing gas can be prevented. Therefore, the ferroelectric capacitor can be formed with excellent hysteresis characteristics, and the semiconductor device equipped with the ferroelectric capacitor has an improved bit yield.

Furthermore, a stopper film that covers the hydrogen barrier film on the ferroelectric capacitor may be provided, wherein the stopper film may preferably be formed from a dielectric material having a smaller etching rate than an etching rate of the interlayer dielectric film.

As a result, the stopper film can be functioned as an etching stopper at the time of etching the interlayer dielectric film, such that differences in the thickness of the interlayer dielectric film can be absorbed by the stopper film, and differences in etching can be almost entirely eliminated. Accordingly, differences in the thickness of the stopper film and the hydrogen barrier film due to differences in the thickness of the interlayer dielectric film can be reduced, and therefore the contact hole can be processed in a highly accurate shape. Therefore, the inner wall surface of the contact hole at the hydrogen barrier film can be formed in a desired shape, and deterioration of the ferroelectric film can be prevented, such that the semiconductor device with favorable bit yield can be provided.

The stopper film may preferably be formed from a material having an etching selection ratio of 15 or higher with respect to the interlayer dielectric film. As a result, the stopper film can be made to function sufficiently, such that the processing accuracy of the inner wall surface of the contact hole at the hydrogen barrier film can be further improved.

Also, the stopper film may preferably have hydrogen barrier property. As a result, a portion of the hydrogen barrier film that is covered by the stopper film has enhanced hydrogen barrier property, such that penetration of reducing gas into the ferroelectric capacitor is further reduced, and therefore deterioration of the ferroelectric film can be more securely prevented.

Also, the stopper film may preferably be comprised of silicon nitride. Normally, the interlayer dielectric film is comprised of silicon oxide, and thus the stopper film comprised of silicon nitride has a sufficiently high etching selection ratio with respect to the interlayer dielectric film comprised of silicon oxide, and therefore can sufficiently function as an etching stopper. Also, as the silicon nitride has hydrogen barrier property, deterioration of the ferroelectric film can be more securely prevented, as described above.

In accordance with an embodiment of the invention, a method for manufacturing a semiconductor device includes the steps of: laminating layers for a first electrode, a ferroelectric film and a second electrode above a substrate to form a ferroelectric capacitor including the first electrode, the ferroelectric film and the second electrode; forming a hydrogen barrier film that covers a top surface and a side surface of the ferroelectric capacitor; forming a stopper film that covers at least a top surface of the hydrogen barrier film; forming an interlayer dielectric film that covers the ferroelectric capacitor and the substrate; etching the interlayer dielectric film, the stopper film and the hydrogen barrier film thereby forming a contact hole that exposes the second electrode; forming a barrier metal that covers an upper surface of the second electrode exposed in the contact hole and an inner wall surface of the contact hole and is composed of a conductive material having hydrogen barrier property; and embedding a plug conductive section conductively connected to the barrier metal inside the contact hole, wherein the stopper film is formed from a dielectric material having a smaller etching rate with respect to the interlayer dielectric film.

As the stopper film is formed from a dielectric material having a smaller etching rate than that of the interlayer dielectric film, the stopper film can be functioned as an etching stopper at the time of etching the interlayer dielectric film in the step of forming a contact hole. Therefore, even when the etching is excessively conducted in consideration of differences in the thickness of the interlayer dielectric film, the differences in the thickness of the interlayer dielectric film are not reflected in the thickness of the stopper film, and therefore the stopper film can be uniformly etched. As a result, the hydrogen barrier film has a uniform thickness, and thus can be processed in a highly accurate shape, such that the inner wall surface of the contact hole at the hydrogen barrier film can be processed in a desired shape, more specifically, a shape in which the inner wall surface has a concave curved surface facing the interior of the contact hole, and the contact hole at the hydrogen barrier film has an inner diameter that gradually becomes smaller toward the second electrode.

As the inner wall surface can be processed in a shape that does not damage the coverage property of the material for the barrier metal, the barrier metal can be formed favorably without generating weak points. Accordingly, when the plug conductive section is formed in a reducing atmosphere, the reducing gas can be prevented from penetrating the ferroelectric capacitor through weak points, and therefore the ferroelectric film can be prevented from being reduced or deteriorated. Therefore, the ferroelectric capacitor can be formed with excellent hysteresis characteristics, and a semiconductor device equipped with the ferroelectric capacitor having a good bit yield can be manufactured.

Figure 1:
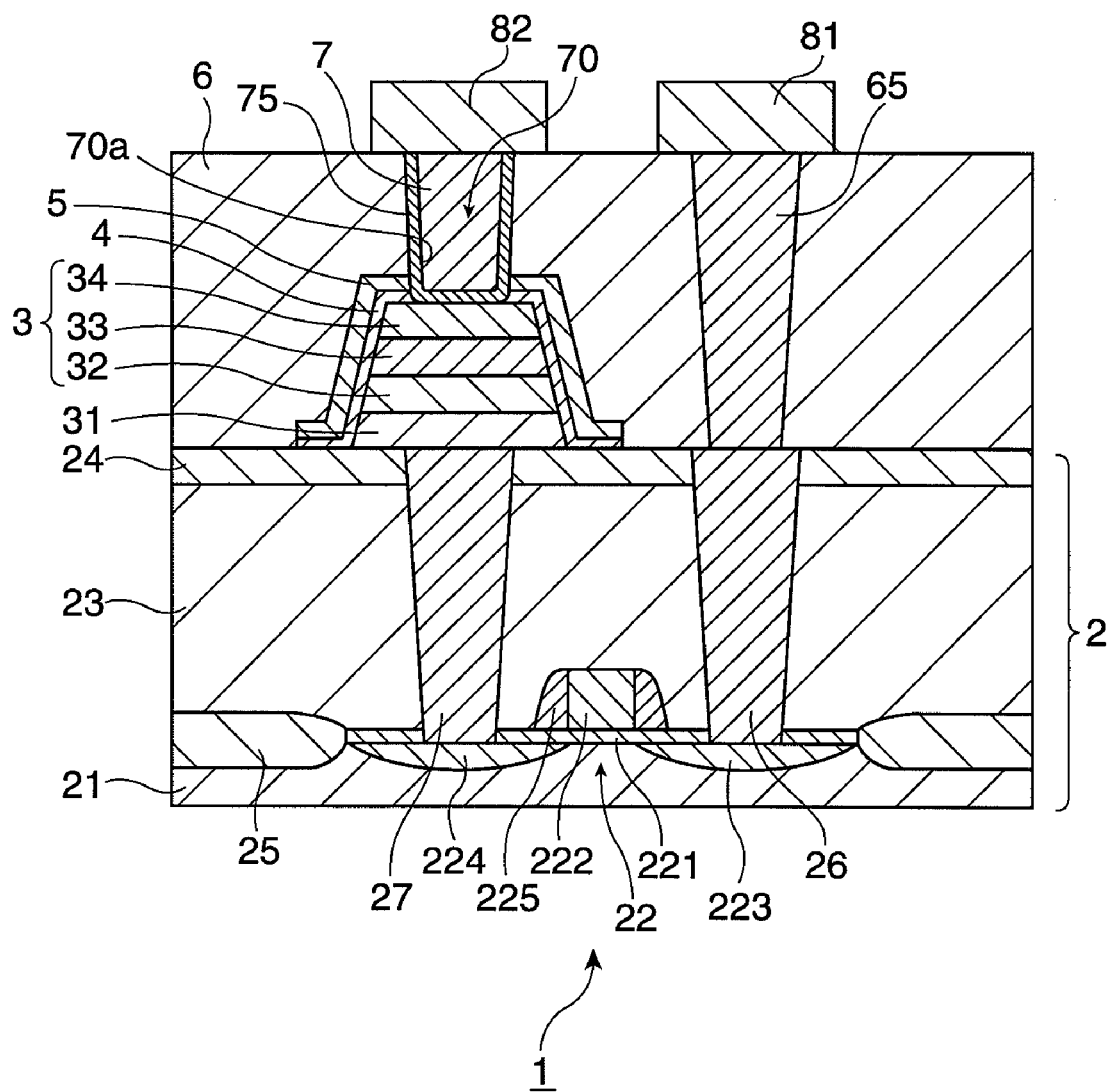
FIG. 1 is a side cross-sectional view of the structure of a semiconductor device in accordance with an embodiment of the invention.

DESCRIPTION OF EXEMPLARY
EMBODIMENTS

An embodiment of the invention is described below with reference to the accompanying drawings. However, it should be noted that the technical scope of the invention is not limited to the embodiment described below. Although various structures may be exemplified in the following description, using the accompanying drawings, the measurement and scale of each of the components of the structures illustrated in the drawings may be appropriately changed with respect to the actual structures so that characteristic features of each of the structures can be readily recognized.

FIG. 1 is a cross-sectional view of the structure of a main portion of a semiconductor device (ferroelectric memory device) 1 in accordance with an embodiment of the invention. As shown in FIG. 1, the ferroelectric memory device 1 has a stacked type structure, and is equipped with a ferroelectric capacitor 3 provided on a base substrate 2, a hydrogen barrier film 4 that covers a top surface and a side surface of the ferroelectric capacitor 3 and a circumferential area around the ferroelectric capacitor 3, a stopper film 5 that covers the hydrogen barrier film 4, and an interlayer dielectric film 6 that covers the stopper film 5 and the base substrate 2. Also, in accordance with the present embodiment, a bit line 81 and a ground line 82 comprised of aluminum are provided on the interlayer dielectric film 6.

The base substrate 2 includes, in accordance with the present embodiment, a transistor 22 provided on a silicon substrate (substrate) 21, a first base dielectric film 23 comprised of $SiO_2$ that covers the transistor 22, and a second base dielectric film 24 comprised of SiN that covers the first base dielectric film 23. Element isolation regions 25 are provided on a surface layer of the silicon substrate 21, wherein each area between the element isolation regions 25 corresponds to each of the memory cells.

The transistor 22 is formed from a gate dielectric film 221 provided on the silicon substrate 21, a gate electrode 222 provided on the gate dielectric film 221, a source region 223 and a drain region 224 provided on both sides of the gate electrode 222 in the surface layer of the silicon substrate 21, and a side wall 225 provided on a side surface of the gate electrode 222. In the present embodiment, a first plug 26 composed of tungsten is provided on the source region 223 in a manner to be conductively connected to the source region 223, and a second plug 27 composed of tungsten is provided on the drain region 224 in a manner to be conductively connected to the drain region 224. The first plug 26 is electrically connected to a third plug 65 composed of tungsten that is provided in the interlayer dielectric film 6, and the third plug 65 is electrically connected to the bit line 81. In other words, the source region 223 of the transistor 22 is electrically connected to the bit line 81.

The ferroelectric capacitor 3 is provided on a second plug 27, and is formed from a lower electrode (first electrode) 32, a ferroelectric film 33 and an upper electrode (second electrode) 34. Further, in the present embodiment, a base conductive section 31 composed of TiAlN is provided between the second plug 27 and the ferroelectric capacitor 3.

In the present embodiment, the lower electrode 32 is formed from an iridium (Ir) film, an iridium oxide (IrOx) film and a platinum (Pt) film sequentially laminated on the base conductive section 31, and is electrically connected to the drain region 224 through the base conductive section 31 and the second plug 27.

The ferroelectric film 33 is provided on the lower electrode 32 and is formed from a ferroelectric material. Typical ferroelectric materials include materials having a perovskite crystal structure that may be expressed by a general formula $ABO_3$, more specifically, for example, PZT ($Pb(Zr, Ti)O_3$), PLZT (($Pb, La)(Zr, Ti)O_3$) and the like, or ferroelectric materials in which metal, such as, niobate (Nb) or the like is added to the aforementioned materials. As the ferroelectric material in the present embodiment, PZT is used.

The upper electrode 34 is formed from a Pt film, an IrOx film and an Ir film sequentially provided on the ferroelectric film 33, and is electrically connected to a fourth plug (plug conductive section) 7 to be described below.

In this manner, each of the upper electrode 34 and the lower electrode 32 may be formed from a laminate of multiple films composed of mutually different materials. As a result, functionalities can be given to the upper electrode 34 and the lower electrode 32, respectively. For example, it is possible to add a function to increase adhesion between the ferroelectric film 33 and the upper electrode 34 and/or between the ferroelectric film 33 and the lower electrode 32, a function as an oxygen barrier film or a hydrogen barrier film, a function to improve the crystal orientation property of the ferroelectric film 33 and the like.

The hydrogen barrier film 4 is formed from a dielectric material having hydrogen barrier property, and for example, aluminum oxide (AlOx) is used as the material for the hydrogen barrier film 4 in the present embodiment. The ferroelectric film 33 of the ferroelectric capacitor 3 is formed from an oxide material, as described above, such that the ferroelectric film 3 may be reduced and deteriorated when exposed to reducing gas such as hydrogen gas. However, by covering the ferroelectric capacitor 3 with the hydrogen barrier film 4, deterioration thereof can be prevented.

The interlayer dielectric film 6 may be formed from, for example, $SiO_2$. The stopper film 5 is formed from a material that can secure an etching selection ratio with respect to the interlayer dielectric film 6, in etching to be conducted to form a contact hole 70 to be described below, and can be made to function as a stopper in the etching. The stopper film 5 may preferably be formed from a material that provides an etching selection ratio of 15 or higher with respect to the interlayer dielectric film 6, such that the stopper film 5 can sufficiently function as a stopper. Also, the stopper film 5 may preferably have hydrogen barrier property, whereby the hydrogen barrier property of the hydrogen barrier film 4 can be reinforced. More specifically, the material for the stopper film 5 may preferably be silicon nitride, such as, SiN, SiON and the like. In accordance with the present embodiment, the stopper film 5 is formed from SiN, and is provided in a manner not only to cover the hydrogen barrier film 4 on the ferroelectric capacitor 3, but to cover the entirety of the hydrogen barrier film 4.

A contact hole 70 that penetrates the interlayer dielectric film 6, the stopper film 5 and the hydrogen barrier film 4, and exposes the upper electrode 34 of the ferroelectric capacitor 3 is formed over the ferroelectric capacitor 3. The contact hole 70 has a circular opening shape, and its interior is provided with a barrier metal 75 that covers the top surface of the upper electrode 34 exposed in the contact hole 70 and an inner wall surface 70a of the contact hole 70. Also, a fourth plug (plug conductive section) 7 is embedded inside the barrier metal 75 in the contact hole 70. The fourth plug 7 is formed from tungsten in the present embodiment, and is conductively connected to the upper electrode 34 through the barrier metal 75, and electrically connected to the ground line 82. In other words, the upper electrode 34 of the ferroelectric capacitor 3 is electrically connected to the ground line 82.

The barrier metal 75 is formed from a conductive material having hydrogen barrier property, and a portion thereof that covers the top surface of the upper electrode 34 can prevent reducing gas from penetrating the ferroelectric capacitor 3 from the side of the contact hole 70. Also, a portion of the barrier metal 75 that covers the inner wall surface 70a inside the contact hole 70 is capable of enhancing the adhesion between the fourth plug 7 and the inner wall surface 70a of the contact hole 70. In the present embodiment, the barrier metal 75 has a two-layer structure in which a Ti film (not shown) and a TiN film (not shown) are sequentially laminated. Also, as the inner wall surface of the contact hole 70 at the hydrogen barrier film 4 is well shaped as described below, the barrier metal 75 is provided with improved material coverage, and does not have weak points. The shape of the inner wall surface of the hydrogen barrier film 4 is described below in detail.

Figure 2A:
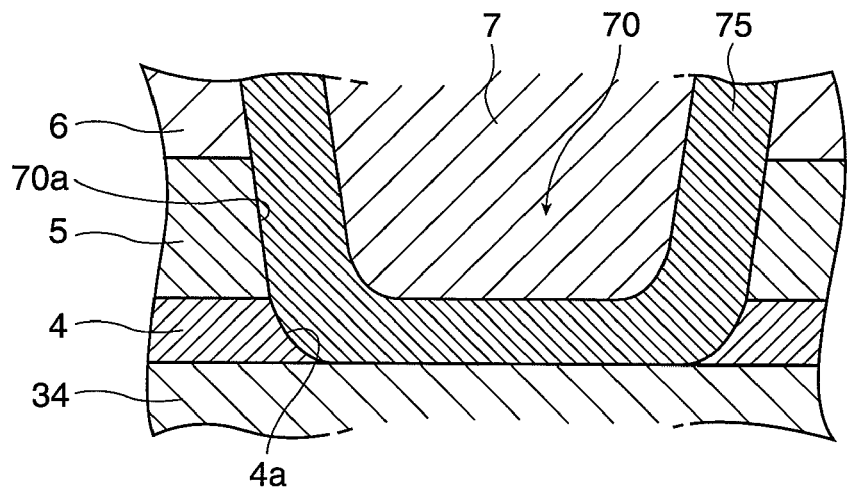
FIGS. 2A-2D are schematic views and graphs for describing the shape of a main portion of the semiconductor device.
Figure 2B:
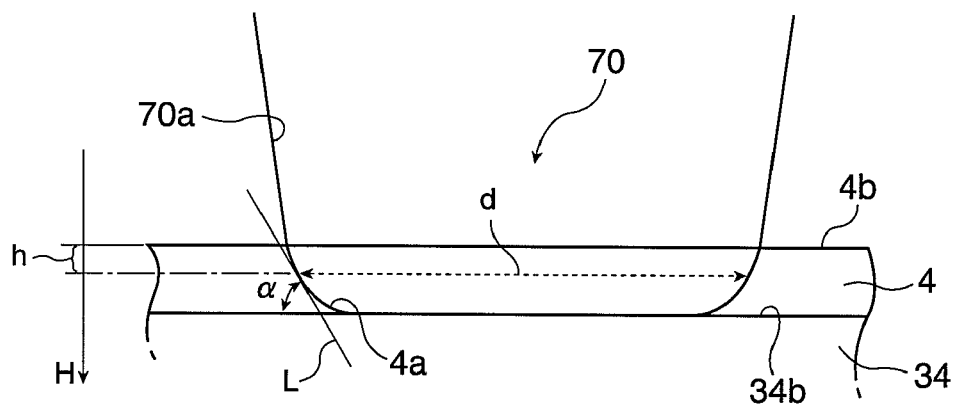
Figure 2C:
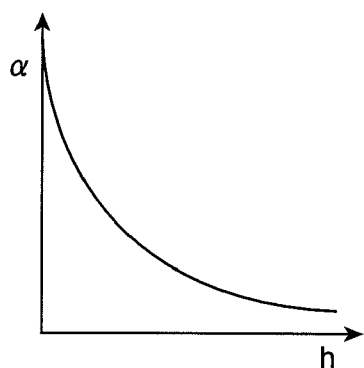
Figure 2D:
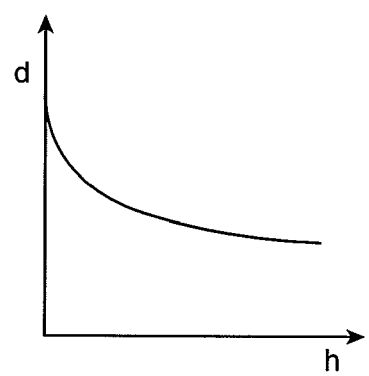

FIG. 2A is an enlarged cross-sectional view of a portion of the contact hole 70 near its bottom surface, and FIG. 2B is a schematic diagram for describing several parameters concerning the configuration representation of the inner wall surface 4a. Also, FIGS. 2C and 2D are graphs showing the relations among the parameters in the shape of the inner wall surface 4a.

As shown in FIG. 2A, the inner wall surface 4a of the hydrogen barrier film 4 includes a concave curved surface facing the interior of the contact hole 70. Also, the inner diameter of the contact hole 70 gradually reduces toward the upper electrode 34. More specifically, by using parameters, the shape of the inner wall surface 4a of the hydrogen barrier film 4 can be expressed as follows.

As shown in FIG. 2B, a distance from a top surface 4b of the hydrogen barrier film 4 in a depth direction H of the contact hole 70 is defined as a depth h. A tangential line that contacts the inner wall surface 4a of the hydrogen barrier film 4 at the depth h in the hydrogen barrier film 4 is defined as a tangential line L. An acute angle among angles of the tangential line L with respect to a top surface 34b of the upper electrode 34 is defined as an angle α. A dimension of the contact hole 70 at the depth h in a direction orthogonal to the depth direction H is defined as an inner diameter d. With the parameters set as described above, it is observed that the angle α decreases monotonically with increasing depth h, as shown in FIG. 2C, and the inner diameter d decreases monotonically with increasing depth h, as shown in FIG. 2D.

Due to the structure described above, upon application of a voltage to the gate electrode 222 of the transistor 22, an electrical field is applied between the source region 223 and the drain region 224 thereby turning on the channel through which an electrical current can be circulated. When the channel is turned on, an electrical signal from the bit line 81 electrically connected to the source region 223 is transmitted to the drain region 224, and then transmitted to the lower electrode 32 of the ferroelectric capacitor 3 electrically connected to the drain electrode 224. Thus, a voltage can be applied between the upper electrode 34 and the lower electrode 32 of the ferroelectric capacitor 3, whereby a charge (data) can be accumulated in the ferroelectric film 33. In this manner, an electrical signal to the ferroelectric capacitor 3 can be switched by the transistor 22, whereby data (charge) can be read from or written in the ferroelectric memory device 1.

Next, a method for manufacturing a semiconductor device in accordance with an embodiment of the invention is described, using a method for manufacturing the ferroelectric memory device 1 as an example.

FIGS. 3A-3D, FIGS. 4A-4C, and FIGS. 5A and 5B are cross-sectional views showing steps of a method for manufacturing a ferroelectric memory device in accordance with the present embodiment.

Figure 3A:
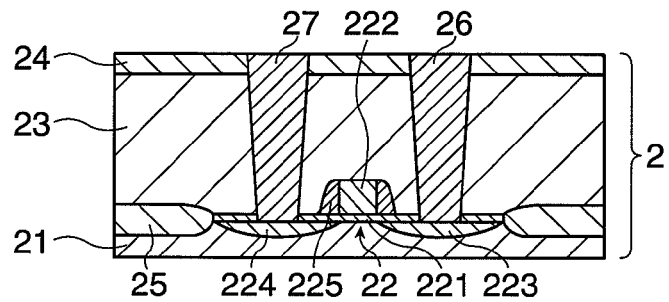
FIGS. 3A-3D are cross-sectional views schematically showing steps of a method for manufacturing a semiconductor device.

First, as shown in FIG. 3A, a base substrate 2 is formed by using a known method. More specifically, for example, element isolation regions 25 are formed in a silicon substrate (substrate) 21 by a LOCOS method, a STI method or the like, and a gate dielectric film 221 is formed on the silicon substrate 21 between the element isolation regions 25 by a thermal oxidation method or the like. Then, a gate electrode 222 composed of polycrystal silicon or the like is formed on the gate dielectric film 221. Then, impurities are implanted in the surface layer of the silicon substrate 21 between the element isolation regions 25 and the gate electrode 222 to form doped regions 223 and 224. Then, an etch-back method or the like is used to form a side wall 225. In accordance with the present embodiment, the doped region 223 may be functioned as a source region, and the doped region 224 may be functioned as a drain region.

Then, a film of $SiO_2$ is formed by, for example, a CVD method to form a first base dielectric film 23 on the silicon substrate 21 where the transistor 22 is formed, and then a film of SiN is formed by, for example, a CVD method to form a second base dielectric film 24 on the first base dielectric film 23. Then, the first base dielectric film 23 and the second base dielectric film 24 over the source region 223 and the drain region 224 are etched, thereby forming a through hole that exposes the source region 223 and a through hole that exposes the drain region 224. Then, for example, films of Ti and TiN are sequentially formed by, for example, a sputter method in the through holes, respectively, thereby forming adhesion layers (not shown).

Then, a film of tungsten is formed by, for example, a CVD method over the entire surface of the second base dielectric film 24 including portions inside the through holes thereby embedding tungsten inside the through holes. Then, the tungsten over the second base dielectric film 24 is polished by a CMP method or the like, thereby removing the tungsten on the second base dielectric film 24. As a result, a first plug 26 and a second plug 27 are embedded in the through holes, respectively. The second base dielectric film 24 composed of SiN has a lower polishing rate in a CMP method than that of the first base dielectric film 23 composed of $SiO_2$, such that portions above the first base dielectric film 23 can be prevented from being excessively polished by the CMP method.

Figure 3B:
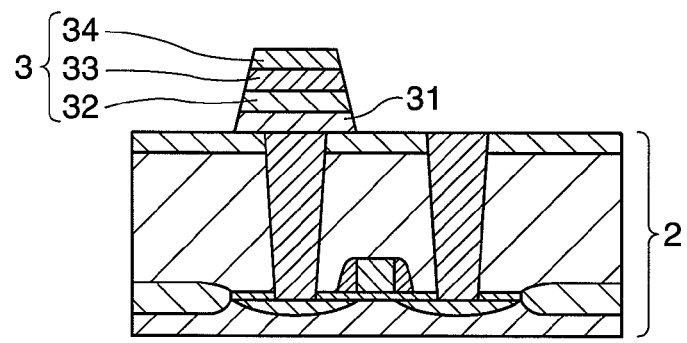

Next, as shown in FIG. 3B, a base conductive section 31 and a ferroelectric capacitor 3 are formed on the base substrate 2. More specifically, first, a layer of material for a base conductive section 31, such as, for example, titanium aluminum nitride (TiAlN) is formed on the base substrate 2 by a sputter method. Then, as materials for a lower electrode 32, for example, iridium (Ir), iridium oxide (IrOx) and platinum (Pt) films are sequentially formed on the layer for the base conductive section 31 by a sputter method. Then, as a material for a ferroelectric film 33, for example, a layer of lead zirconate titanate (Pb(Zi, Ti)$O_3$:PZT) is formed on the layer for the lower electrode layer by a sol-gel method, a sputter method, a MOCVD method or the like. Then, as a material for an upper electrode 34, for example, Pt, IrOx and Ir films are sequentially formed on the layer for the ferroelectric film 33 by a sputter method.

Then, a resist pattern (not shown) is formed on the top surface of the material films, in other words, on the film that becomes the upper electrode 34 by, for example, known resist technique and photolithography method. By using the resist pattern as a mask, the material films are etched, thereby forming the base conductive section 31, and the ferroelectric capacitor 3 having the lower electrode 32, the ferroelectric film 33 and the upper electrode 34 sequentially laminated on the base conductive section 31.

Figure 3C:
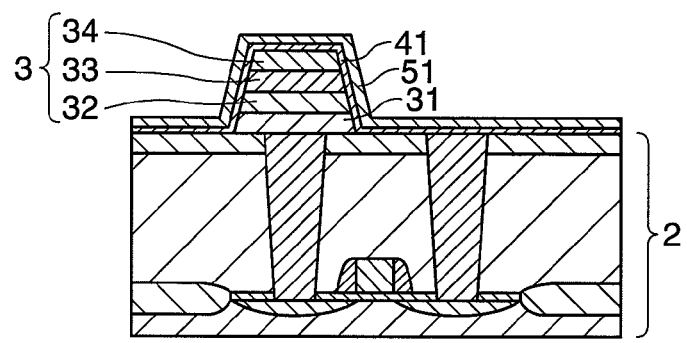
Figure 3D:
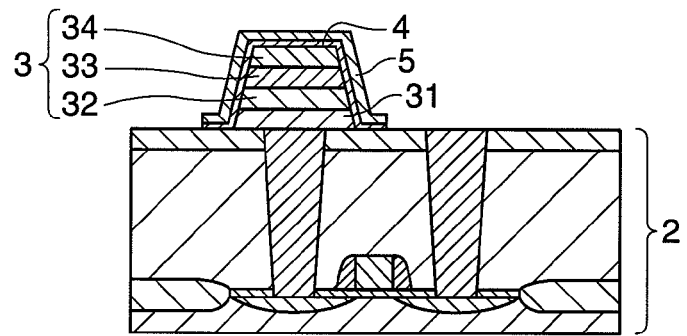

Next, as shown in FIG. 3C, a material film for a hydrogen barrier film 4, for example, an AlOx film 41, and a material film for a stopper film 5, for example, a SiN film 51 are sequentially formed by a sputter method, a CVD method or the like, on the entire top surface of the base substrate 2 including the ferroelectric capacitor 3. Then, as shown in FIG. 3D, the AlOx film 4 and the SiN film 5 are patterned by using known resist technique and etching technique, thereby forming the hydrogen barrier film 4 that covers the top surface and the side surface of the ferroelectric capacitor 3, and the stopper film 5 that covers the hydrogen barrier film 4 on the ferroelectric capacitor 3. In accordance with the present embodiment, the AlOx film 41 is patterned in a manner that the hydrogen barrier film 4 covers not only the top surface and side surface of the ferroelectric capacitor 3, but also the side surface of the base conductive section 31 and the base substrate 2 in a circumferential area around the ferroelectric capacitor 3. Also, the SiN film 51 is patterned in a manner that the stopper film 5 entirely covers the hydrogen barrier film 4.

Figure 4A:
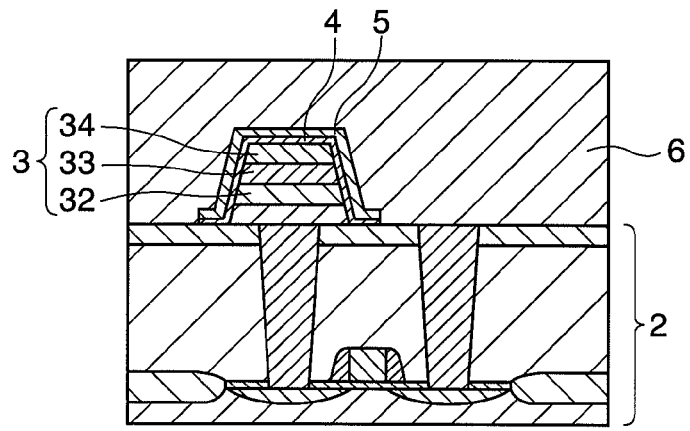
FIGS. 4A-4C are cross-sectional views schematically showing steps of the method for manufacturing a semiconductor device.

Next, as shown in FIG. 4A, $SiO_2$ is deposited in a layer in a manner to cover the base substrate 2 including the stopper film 5 by a CVD method, using, for example, TEOS or the like as the source material gas, and then the layer is thinned by a CMP method, an etch-back method or the like, thereby forming an interlayer dielectric film 6. In general, when the material gas (TEOS) for the interlayer dielectric film 6 chemically reacts, reducing gas, such as, hydrogen gas, water vapor and the like is generated. The ferroelectric film 33 of the ferroelectric capacitor 3 is formed from an oxide material (i.e., PZT in accordance with the present embodiment), and oxygen deficiencies would occur in the ferroelectric film 33 when exposed to the reducing gas, whereby the ferroelectric film 33 would be deteriorated as its ferroelectric characteristics are damaged. However, as the hydrogen barrier film 4 that covers the ferroelectric capacitor 3 is formed in the present embodiment, the ferroelectric capacitor 3 is prevented from being exposed to hydrogen gas, and therefore the interlayer dielectric film 6 can be formed without deteriorating the ferroelectric film 33. Furthermore, the stopper film 5 composed of SiN as its material having hydrogen barrier property is formed in a manner to cover the entirety of the hydrogen barrier film 4, such that the hydrogen barrier property of the hydrogen barrier film 4 is reinforced, and deterioration of the ferroelectric film 33 can be more securely prevented.

It is noted that, when a silicon wafer is used as the silicon substrate 21, similarly as in an ordinary method, it is difficult to make the amount of deposited $SiO_2$ and its film quality uniform across the surface of the silicon wafer, for example, between the center area and the peripheral area of the silicon wafer, or between an area where the ferroelectric capacitors 3 are densely formed and an area where the ferroelectric capacitors 3 are sparsely formed. Further, when the deposited $SiO_2$ film is thinned by polishing, the amount of polishing would vary from one area to another, if the amount of deposited $SiO_2$ and its film quality are not uniform. As a result, the thickness of the interlayer dielectric film 6 has variations of about 20 nm to 30 nm.

Figure 4B:
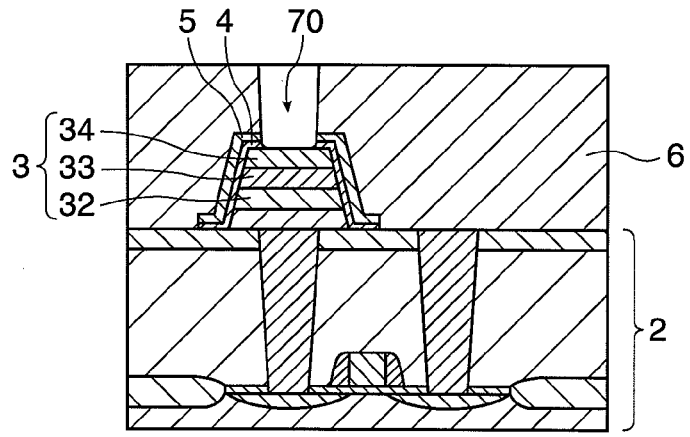

Next, as shown in FIG. 4B, the interlayer dielectric film 6, the stopper film 5 and the hydrogen barrier film 4 over the ferroelectric capacitor 3 are etched, thereby forming a contact hole 70 that exposes the upper electrode 34 of the ferroelectric capacitor 3. More specifically, first, a resist pattern is formed on the interlayer dielectric film 6 by using, for example, known resist technique and photolithography method. Then, by using the resist pattern as a mask, the interlayer dielectric film 6 is etched by a dry etching method or the like.

Since a fourth plug 7 (see FIG. 1) that is to be embedded in the contact hole 70 in a later step needs to be conductively connected to the upper electrode 34 of the ferroelectric capacitor 3, the interlayer dielectric film 6 needs to be securely penetrated by the contact hole 70. The interlayer dielectric film 6 has differences of about 20 nm to 30 nm in its thickness, as described above. Therefore, the etching may need to be excessively conducted such that the thickest portion of the interlayer dielectric film 6 is penetrated, in consideration of the differences in the thickness.

Therefore, the stopper film 5 would have differences in its thickness because of excessive etching of the interlayer dielectric film 6. In other words, the stopper film 5 would hardly be etched at thick portions of the interlayer dielectric film 6, while the stopper film 5 would become thinned at thin portions of the interlayer dielectric film 6 because the stopper film 5 is exposed to the etching gas by the time the thick portions are penetrated.

However, the stopper film 5 is formed from a material that can secure an etching selection ratio with respect to the interlayer dielectric film 6, such that the amount of the stopper film 5 etched at the time of etching the interlayer dielectric film 6 becomes extremely small, and the stopper film 5 has very small differences in its thickness.

In accordance with the present embodiment, the etching selection ratio of the stopper film 5 with respect to the interlayer dielectric film 6 is set to about 20. For example, when differences in the thickness of the interlayer dielectric film 6 are 40 nm, the stopper film 5 may be etched by about 2 nm maximum in thickness, while the interlayer dielectric film 6 is etched.

Then, the stopper film 5 is etched, using the resist pattern as a mask. It is noted that the stopper film 5 has a uniform thickness such that the amount of the hydrogen barrier film 4 to be etched becomes uniform when the stopper film 5 is excessively etched. For this reason, when etching the hydrogen barrier film 4, the hydrogen barrier film 4 does not need to be excessively etched in consideration of differences in its thickness because the hydrogen barrier film 4 has a uniform thickness, and therefore can be etched under an optimum etching condition. Therefore, the inner wall surface 4a (see FIG. 2A) of the contact hole 70 at the hydrogen barrier film 4 can be processed in a desired shape, and can be provided with a concave curved surface facing the interior of the contact hole 70. After the interlayer dielectric film 6 has been etched, the sum of difference in the thickness of the hydrogen barrier film 4 and difference in the thickness of the stopper film 5 is about 3 nm including difference in the film thickness that may be generated at the time of formation of these films, which is considerably smaller than the difference in the thickness of the interlayer dielectric film 6.

Figure 4C:
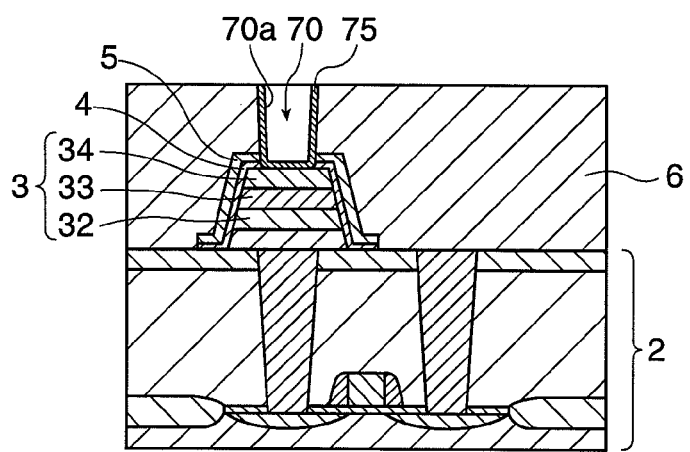

Next, as shown in FIG. 4C, a barrier metal 75 is formed from a conductive material having hydrogen barrier property in a manner to cover the upper electrode 34 exposed in the contact hole 70 and an inner wall surface 70a of the contact hole 70. In accordance with the present embodiment, films of Ti and TiN are sequentially formed by a sputter method, thereby forming the barrier metal 75 in a two-layer structure composed of the Ti film and the TiN film. In accordance with the present embodiment, the stopper film 5 is formed, and therefore the barrier metal 75 can be formed without generating weak points.

According to a method in related art, a stopper film is not formed, and therefore a hydrogen barrier film has differences in the amount of etching which are caused by differences in the thickness of the interlayer dielectric film. For example, when the hydrogen barrier film is excessively etched, the inner wall surface of the contact hole at the hydrogen barrier film has a steeply extending wall shape with respect to the top surface of the upper electrode. As a result, it is difficult to fill the material of the barrier metal in the corner between the inner wall surface of the hydrogen barrier film and the top surface of the upper electrode. Also, for example, when the hydrogen barrier film is etched insufficiently, the inner wall surface of the contact hole forms a stepped configuration (a convex shape protruding toward the interior of the contact hole) that protrudes toward the interior of the contact hole between the interlayer dielectric film side and the hydrogen barrier film side. For this reason, the coverage of the material of the barrier metal is damaged at the stepped section. In this manner, the portion of the barrier metal that is not formed in good quality has an insufficient thickness and forms crack-like grooves, which present weak points.

In contrast, in accordance with the present embodiment of the invention, the stopper film 5 is formed and therefore the hydrogen barrier film 4 can be processed in a desired shape, such that the inner wall surface 4a can be formed in a concave curved surface facing the interior of the contact hole 70. Therefore, the material of the barrier metal 75 can be adhered well, and the barrier metal 75 can be formed without generating weak points.

Figure 5A:
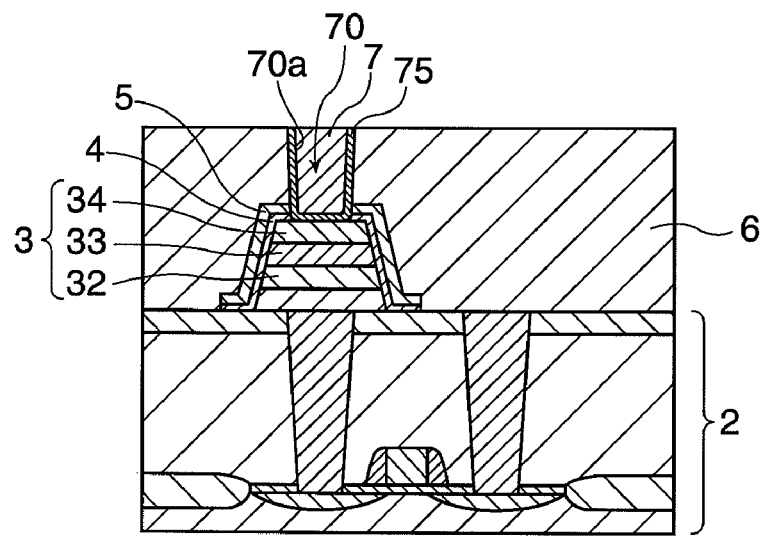
FIGS. 5A and 5B are cross-sectional views schematically showing steps of the method for manufacturing a semiconductor device.
Figure 5B:
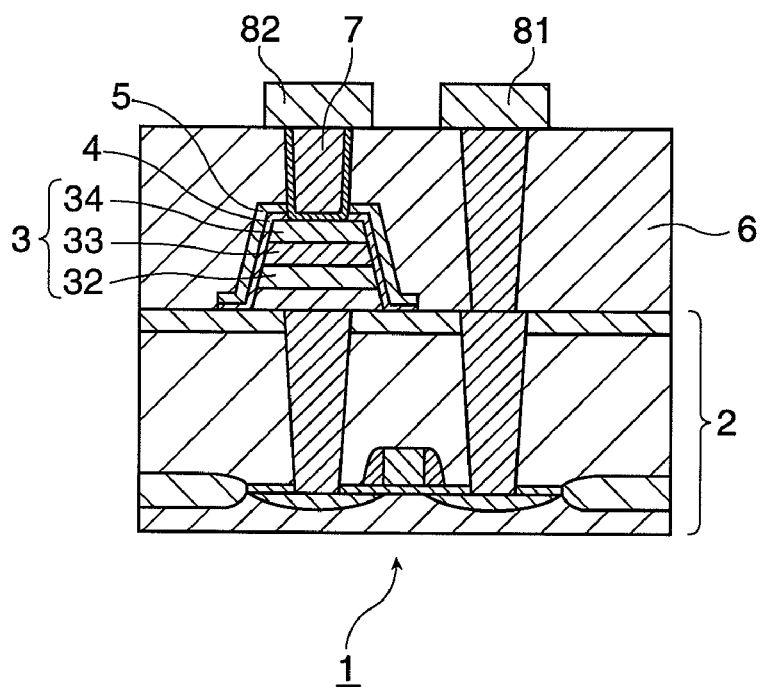

Next, as shown in FIG. 5A, a fourth plug (plug conductive section) 7 that conductively connects to the barrier metal 75 is embedded in the contact hole 70. More specifically, for example, tungsten is deposited in a film by a CVD method on the entire surface of the interlayer dielectric film 6 including inside the contact hole 70, thereby embedding the tungsten inside the contact hole 70. Then, by polishing portions over the interlayer dielectric film 6 by a CMP method or the like, the tungsten on the interlayer dielectric film 6 is removed, and the fourth plug 7 is embedded in the contact hole 70.

Normally, film formation is conducted in a reducing atmosphere according to a CVD method. However, in the method according to the present embodiment, the barrier metal 75 having hydrogen barrier property which covers the upper electrode 34 is formed, and weak points are not generated in the barrier metal 75. As a result, the reducing gas, such as, water vapor, hydrogen gas and the like cannot penetrate the ferroelectric capacitor 3 through weak points, and therefore the ferroelectric film 33 can be prevented from being reduced or deteriorated.

Next, a third plug 65 is formed on the first plug 26 in the interlayer dielectric film 6, in a manner to be conductively connected to the first plug 26. More specifically, a through hole that exposes the first plug 26 is formed, like the first plug 26. Then, films of Ti and TiN are sequentially formed by a sputter method in the through hole, thereby forming an adhesion layer (not shown). Then, a film of tungsten is formed by, for example, a CVD method on the entire top surface of the interlayer dielectric film 6 including inside the through hole, thereby embedding the tungsten inside the through hole. Portions over the interlayer dielectric film 6 are polished by a CMP method or the like, whereby the tungsten on the interlayer dielectric film 6 is removed, leaving a third plug 65 embedded inside the through hole.

Then, a film of aluminum is formed by, for example, a sputter method on the interlayer dielectric film 6 where the third plug 65 is formed, and the film is patterned by known resist technique and etching technique, thereby forming a bit line 81 conductively connected to the third plug 65 and a ground line 82 conductively connected to the fourth plug 7. In this manner, the ferroelectric memory device 1 can be manufactured.

By the method for manufacturing a semiconductor device in accordance with the embodiment of the invention, the stopper film 5 is formed, such that the contact hole 70 can be formed in a highly accurate shape, and the inner wall surface 4a of the hydrogen barrier film 4 can be formed in a desired shape. Therefore, the barrier metal 75 can be formed without generating weak points. As a result, when forming the fourth plug (plug conductive section) 7, the ferroelectric film 33 of the ferroelectric capacitor 3 can be prevented from being reduced or deteriorated. In this manner, the ferroelectric capacitor 3 having excellent hysteresis characteristics can be manufactured, and a favorable ferroelectric memory device (a semiconductor device) 1 equipped with such a ferroelectric capacitor can be manufactured.

Also, in the ferroelectric memory device 1 manufactured by the manufacturing method in accordance with the present embodiment of the invention, the ferroelectric film 33 of the ferroelectric capacitor 3 is prevented from being reduced or deteriorated, such that the ferroelectric memory device 1 equipped with the ferroelectric capacitor 3 having excellent hysteresis characteristics achieves a favorable bit yield.

Moreover, although the present embodiment is applied to a stacked type ferroelectric memory device 1, the embodiment may be applied to a planer type or the like. Also, instead of successively forming a material film for the hydrogen barrier film 4 and a material film for the stopper film 5 as in the embodiment, a material film for the hydrogen barrier film 4 may be formed and then patterned to form the hydrogen barrier film 4. Thereafter, the stopper film 5 may be formed. In this case, the stopper film 5 may be formed in a manner not only to cover the hydrogen barrier film 4 but also to extend from the hydrogen barrier film 4 over to the base substrate 2, for example, to cover the entire surface of the base substrate 2. As a result, when forming a through hole by etching the interlayer dielectric film 6 at the time of forming the third plug 65, the stopper film 5 on the first plug 26 can be functioned as an etching stopper. Moreover, by forming the stopper film 5 and the second base dielectric film 24 from the same material, adhesion between these films can be increased, such that, for example, the hydrogen barrier film 4 can be prevented from peeling off (lifting off) the base substrate 2 or the ferroelectric capacitor 3.

Also, it is possible to use a structure in which the bit line 81 and the ground line 82 may be interchanged with each other, so that the upper electrode 34 of the ferroelectric capacitor 3 becomes conductive with the bit line, and other wiring structures such as multilayer wirings and the like may be used.

Moreover, the contact hole 70 and the through hole in which the third plug 65 is embedded may be formed in a batch by etching. In this case, the barrier metal 75 and the adhesion layer within the through hole, and the fourth plug 7 and the third plug 65 may be concurrently formed. In this case, however, the etching selection ratio of the stopper film 5 with respect to the interlayer dielectric film 6 may preferably be set to 20 or higher.

What is claimed is:

1. A semiconductor device comprising:
    a ferroelectric capacitor including a first electrode, a ferroelectric film, and a second electrode, the first electrode being disposed above a substrate, the ferroelectric film being disposed on the first electrode, the second electrode being disposed on the ferroelectric film;
    a hydrogen barrier film disposed on a top surface and a side surface of the ferroelectric capacitor;
    an interlayer dielectric film disposed on the hydrogen barrier film;
    a first contact hole that opens the interlayer dielectric film;
    a second contact hole that opens the hydrogen barrier film on the second electrode, the second contact hole connecting to the first contact hole;
    a barrier metal that suppresses a diffusion of hydrogen, the barrier metal disposed on a top surface of the second electrode, an inner wall surface of the first contact hole, and an inner wall surface of the second contact hole; and
    a plug section disposed on the barrier metal in the first contact hole,
    a cross section of the inner wall surface of the second contact hole being concave,
    an angle between a tangential line of the cross section of the inner wall surface of the second contact hole and a top surface of the second electrode decreasing as a distance from a top surface of the hydrogen barrier film to a bottom surface of the hydrogen barrier film increasing for an entirety of the second contact hole,
    an area of a bottom surface of the second contact hole being smaller than an area of a top surface of the second contact hole.

2. A semiconductor device according to claim 1, comprising a stopper film that covers the hydrogen barrier film on the ferroelectric capacitor, wherein the stopper film is formed from a dielectric material having a smaller etching rate than an etching rate of the interlayer dielectric film.

3. A semiconductor device according to claim 2, wherein the stopper film is formed from a material having an etching selection ratio of 15 or higher with respect to the interlayer dielectric film.

4. A semiconductor device according to claim 2, wherein the stopper film has hydrogen barrier property.

5. A semiconductor device according to claim 2, wherein the stopper film is formed from silicon nitride.

6. The semiconductor device according to claim 1, further comprising:
- a stopper film disposed between the hydrogen barrier film and the interlayer dielectric film;
- a third contact hole that opens the stopper film; and
- the third contact hole connecting the first contact hole and the second contact hole.

7. The semiconductor device according to claim 6, wherein the stopper film entirely covers the hydrogen barrier film.

8. The semiconductor device according to claim 6, wherein the stopper film includes silicon nitride, and the hydrogen barrier film includes aluminum oxide.

9. The semiconductor device according to claim 1, wherein the barrier metal has a layered structure, and the layered structure includes a titanium layer and a titanium nitride layer.

10. The semiconductor device according to claim 9, wherein the plug section includes tungsten.

11. The semiconductor device of claim 1, wherein a cross section of the inner wall surface of the second contact hole includes a radius of curvature.

12. A method of manufacturing a semiconductor device, comprising:
- forming a ferroelectric capacitor above a substrate, the ferroelectric capacitor including a first electrode, a ferroelectric film, and a second electrode;
- forming a hydrogen barrier film on the ferroelectric capacitor;
- forming a stopper film on the hydrogen barrier film;
- forming an interlayer dielectric film on the hydrogen barrier film;
- forming a first contact hole by etching the interlayer dielectric film;
- etching the stopper film, an etching rate of the stopper film being smaller than an etching rate of the interlayer dielectric film;
- forming a second contact hole by etching the hydrogen barrier film;
- forming a barrier metal on a top surface of the second electrode, an inner wall surface of the first contact hole, and an inner wall surface of the second contact hole, the barrier metal suppressing a diffusion of hydrogen; and
- forming a plug section on the barrier metal in the first contact hole;
- a cross section of the inner wall surface of the second contact hole being concave,
- an angle between a tangential line of the cross section of the inner wall surface of the second contact hole and a top surface of the second electrode decreasing as a distance from a top surface of the hydrogen barrier film to a bottom surface of the hydrogen barrier film increasing for an entirety of the second contact hole.

13. The method of claim 12, wherein a cross section of the inner wall surface of the second contact hole includes a radius of curvature.

* * * * *